(12) United States Patent
Gäbler et al.

(10) Patent No.: US 12,183,763 B2
(45) Date of Patent: Dec. 31, 2024

(54) SEMICONDUCTOR IMAGING APPARATUS AND METHOD

(71) Applicants: Daniel Gäbler, Apolda (DE); Alexander Zimmer, Uhlstädt-Kirchhasel (DE)

(72) Inventors: Daniel Gäbler, Apolda (DE); Alexander Zimmer, Uhlstädt-Kirchhasel (DE)

(73) Assignee: X-FAB GLOBAL SERVICES GMBH, Erfurt (DE)

( * ) Notice: Subject to any disclaimer, the term of this patent is extended or adjusted under 35 U.S.C. 154(b) by 425 days.

(21) Appl. No.: 17/506,884

(22) Filed: Oct. 21, 2021

(65) Prior Publication Data

US 2022/0149105 A1 May 12, 2022

(30) Foreign Application Priority Data

Nov. 12, 2020 (GB) .................................... 2017866

(51) Int. Cl.
*H01L 27/146* (2006.01)
*H01L 27/12* (2006.01)
*H01L 31/107* (2006.01)

(52) U.S. Cl.
CPC ........ *H01L 27/14643* (2013.01); *H01L 27/12* (2013.01); *H01L 27/14621* (2013.01); *H01L 27/14636* (2013.01); *H01L 31/107* (2013.01)

(58) Field of Classification Search
CPC .............. H01L 27/12; H01L 27/14643; H01L 27/14621; H01L 27/14636; H01L 31/107
See application file for complete search history.

(56) References Cited

U.S. PATENT DOCUMENTS

| | | |
|---|---|---|
| 8,344,306 B2 | 1/2013 | Kim |
| 2016/0088265 A1 | 3/2016 | Lu et al. |
| 2016/0240579 A1 | 8/2016 | Sun et al. |
| 2017/0186798 A1 | 6/2017 | Yang et al. |
| 2018/0084167 A1* | 3/2018 | Qian ..................... G01J 3/0208 |
| 2020/0105812 A1 | 4/2020 | Sze |
| 2020/0106971 A1* | 4/2020 | Winzenread ........... H04N 25/75 |
| 2021/0105412 A1* | 4/2021 | Cui ....................... H04N 23/672 |

FOREIGN PATENT DOCUMENTS

| | | |
|---|---|---|
| GB | 2485996 | 6/2012 |
| WO | 2020/053564 | 3/2020 |

OTHER PUBLICATIONS

GB, Intellectual Property Office Examination Report under Section 18(3) dated Dec. 22, 2022 which pertains to GB Patent Application No. GB2017866.1. 3 pages.
GB, Intellectual Property Office; Combined Search and Examination Report under Sections 17 and 18(3); GB patent application serial No. GB2017866.1; 6 pages (Apr. 14, 2021).

* cited by examiner

*Primary Examiner* — Thanh Luu
(74) *Attorney, Agent, or Firm* — Thompson Hine LLP

(57) ABSTRACT

A semiconductor imaging apparatus including a light detection device in a silicon substrate, an optical filter arranged to filter light incident on the light detection device and including a gap for allowing unfiltered light to reach the silicon substrate, an isolation structure for stopping light generated charge carriers in the silicon substrate from reaching the light detection device, and a photodiode for detecting the charge carriers.

14 Claims, 5 Drawing Sheets

SEMICONDUCTOR IMAGING APPARATUS AND METHOD

This application claims priority to United Kingdom Patent Application No. 2017866.1 entitled Semiconductor Imaging Apparatus and Method, filed on Nov. 12, 2020, the entire contents of which are hereby incorporated by reference.

TECHNICAL FIELD

The disclosure relates to a semiconductor imaging apparatus, typically comprising an isolated SPAD and IR filter, and an associated method.

BACKGROUND

Semiconductor imaging apparatus can be used for proximity sensing, using typically time-of-flight (TOF) measurements, or for classical photodiode imaging. Some different methods of combining the two have also been suggested. To perform TOF measurements single photon avalanche diodes (SPADs) are often used, which are reverse biased over the breakdown limit, allowing them to detect a single photon.

U.S. Pat. No. 8,344,306 describes an approach to select visible and non-visible light for different pixels by using a beam splitter and time division methods.

GB Patent No. 2,485,996 suggests that the signal can be distinguished by an optical divider and with distinct pixels for each type of measurement.

International Publication No. WO 2020/053564 describes another approach that uses light absorption in different tiers. For example, back side illumination can be used with photodiodes on different tiers to detect different wavelengths.

SUMMARY

Aspects of the invention provide a semiconductor imaging apparatus and a method of imaging for such an apparatus as set out in the appended claims. In one embodiment, the invention is a semiconductor imaging apparatus including a plurality of light detection devices in a silicon substrate and an optical filter arranged to filter light incident on the light detection devices and including gaps for allowing unfiltered light to reach the silicon substrate between neighboring light detection devices. The apparatus can further include an isolation structure for stopping light generated charge carriers in the silicon substrate from reaching the light detection devices and a plurality of photodiodes for detecting the charge carriers in the silicon substrate.

Certain embodiments of the invention will now be described with reference to the accompanying drawings.

DETAILED DESCRIPTION

The present disclosure can effectively merge proximity sensing and "classical" imaging in one pixel by design. Classical imaging comprises color and/or greyscale imaging (e.g. taking a photo with a normal digital camera). Proximity sensing can be performed by Time-of-Flight (TOF), for example using single photon avalanche diodes (SPADs), which can detect photons at precise times. TOF is a method of measuring distance between a sensor and an object based on the time between the emission of a signal and detecting the signal at the sensor after being reflected by the object. Large arrays can be used to get information about both distance and the local resolution.

Figure 1:
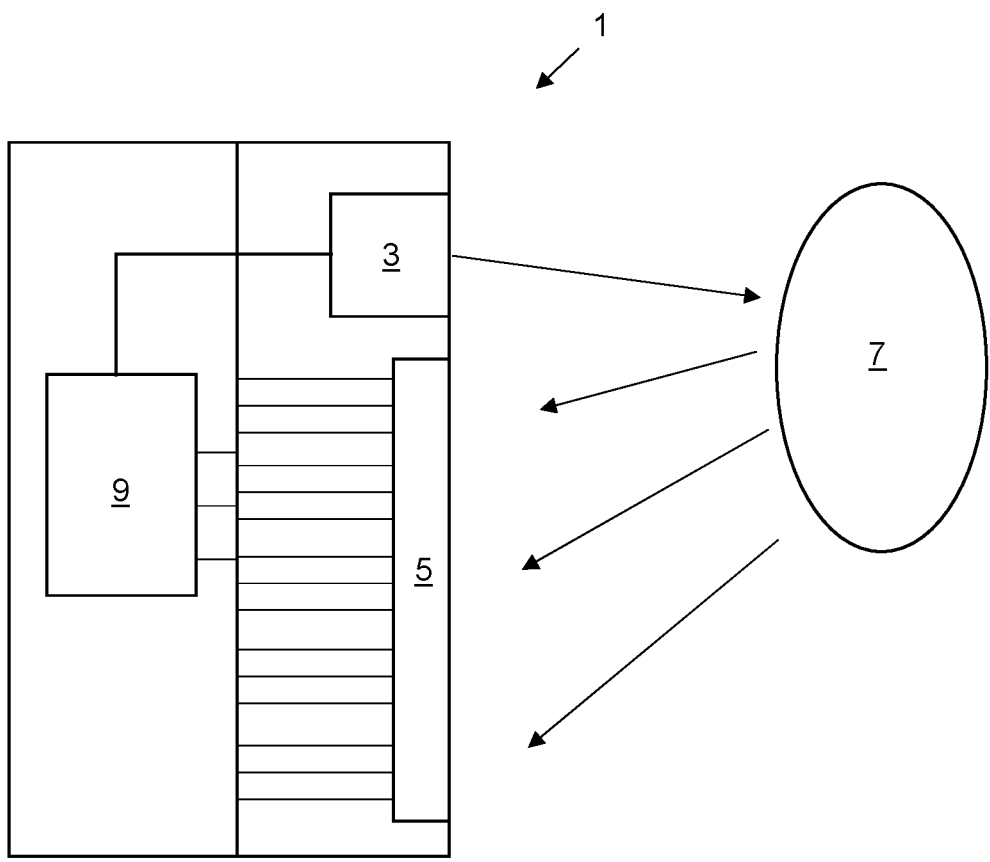
FIG. 1 shows a schematic diagram of an imaging apparatus with a SPAD array.

FIG. 1 shows a schematic diagram of an imaging apparatus 1 using TOF. The apparatus 1 has a an infrared (IR) emitter 3 for emitting pulsed IR light, and a SPAD array 5 for detecting incoming IR light (e.g. reflected from an object 7). A controller and processing circuit 9 is used to trigger the emitter 3 and to determine the time of arrival of photons detected by the array 5. The processing circuit 9 then calculates the distance to the object from the time difference between triggering the emitter 3 and the time of arrival of photons. The distance is simply half the travel time of the detected photon multiplied by the speed of light. In general hundreds or thousands of events are detected in a single sensor cycle, and statistical analysis (e.g. curve fitting) can be used to determine the correct travel time.

The information that is missing is from the classical image of the object. To obtain the classical image, an array of photodiodes or an image sensor pixel is required. Normally, this would also mean that a separate chip is required. The extra chip can complicate the integrated circuit (IC) design, read-out, data handling and space consumption on the chip, which in turn can lead to higher costs.

It is proposed to solve this problem with an isolated light detection device, typically an isolated SPAD. State of the art TOF uses a detection wavelength in the range of 850 nm to 940 nm. Therefore, a narrow bandpass filter for the SPAD is typically used, so that the ambient light does not distort the in-depth information. For example, only the near-infrared light may be detected by the SPAD, which gives information for proximity sensing. If this bandpass filter has some gaps between the light detection devices, then the device isolation can be used to detect the ambient light. The detected ambient light can then be used to generate a grey scale image. Advantageously, both sensing methods are used within one pixel. If, in addition, color filters are applied to the array, color information can also be captured to generate a color image. Accordingly, one advantage of the invention is the use of one chip instead of two chips for the two different sensing modes.

Due to the gap(s) in the bandpass filter, visible (VIS) light can pass into the silicon between the isolated SPADs. To make sure that this light is only detected outside the isolation area, the optical filter (e.g. IR filter) is configured to overlap the isolation. Light generated carriers in the silicon can be collected either directly using well isolation or by placing a pn-junction (i.e. a photodiode) outside the isolated area. Greyscale imaging and proximity sensing is enabled from one pixel.

Figure 2:
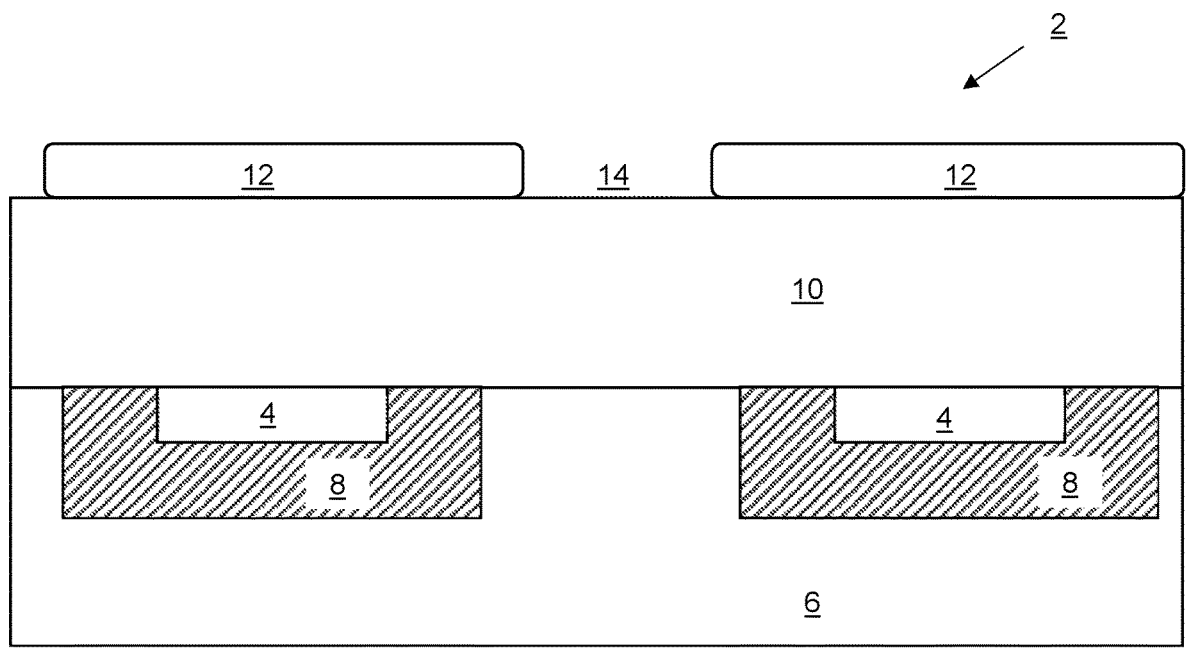
FIG. 2 shows a schematic cross section of a part of a semiconductor imaging apparatus according to an embodiment, wherein an isolation well is used as a photodiode.

FIG. 2 shows a part of a semiconductor imaging apparatus 2 according to an embodiment. The light detector 2 comprises light detection devices being SPADs 4 in a silicon substrate 6 and isolated by respective isolation wells 8. The light detector further comprises a backend stack 10 comprising a plurality of metal layers (not shown) for providing input and output connections to the SPADs 4 and the isolation wells 8. For example, the SPADs 4 may be connected to a first metal layer closest to the substrate 6, and the isolation wells 8 to a second metal layer above the first metal layer. Alternatively, both the SPADs 4 and the isolation wells 8 can be connected to separate metal lines in the same metal layer. An optical filter 12 being an IR filter (e.g. a 940 nm bandpass filter) is arranged on the backend stack 10 and covers the SPADs 4 and the isolation wells 8, so that only filtered light (light that has passed through the optical filter 12) reaches the SPADs 4. The optical filter 12 has gaps 14 (i.e. apertures) in it, which allow unfiltered light to reach the silicon substrate 6 outside the isolation wells 8. Light generated carriers in the silicon can then diffuse to one of the isolation wells 8, which detects those charge carriers. The output from the isolation wells 8 can then be used to form an image from the unfiltered light.

Figure 3:
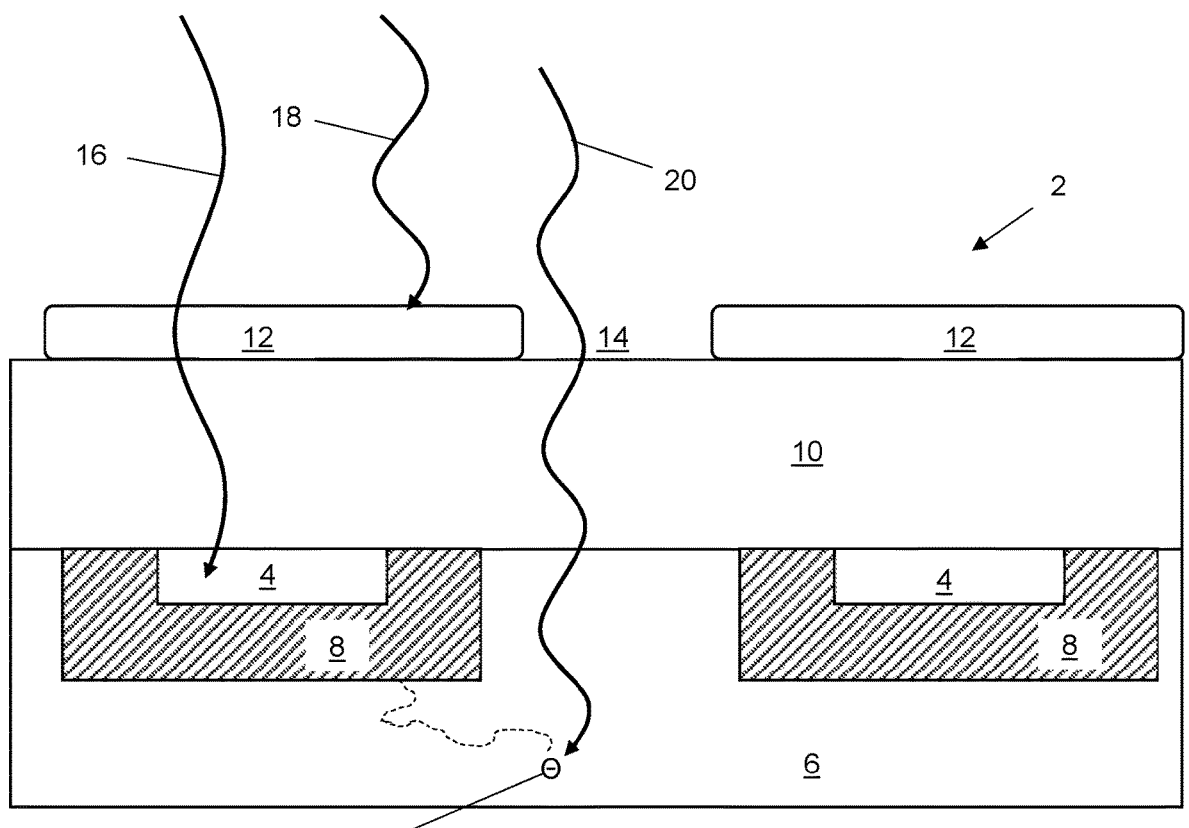
FIG. 3 shows another schematic cross section illustrating said imaging apparatus in use.

FIG. 3 shows a part of a semiconductor imaging apparatus 2 in use, with light of different wavelengths incident on the light detector 2. Equivalent or similar features in different figures have been given the same reference numerals for ease of understanding and are not intended to limit the features of the embodiments. A first photon 16 incident on the optical filter 12 and having a wavelength in the band of the filter 12 (e.g. λ=940 nm) passes through the filter 12 and is detected by the underlying SPAD 4. A second photon 18, having a wavelength outside the band of the filter 12, is stopped by the filter 12. Another photon 20 is incident on the gap 14 of the optical filter 12 and reaches the silicon substrate 6 outside the isolation wells 8. In the silicon substrate 6, the photon 20 generates a charge carrier 22, which diffuses through the silicon 6 and into one of the isolation wells 8. The isolation well 8 is arranged as a photodiode and detects the charge carrier 22. Hence, the first photon 16 is detected by the SPAD 4, which can be used to determine the distance to the source (i.e. the reflecting/scattering object) of the photon 16, and the other photon 20 is detected by the isolation well 8, and can be used in forming a classic image.

The light detectors in FIGS. 2 and 3 typically comprise an array with a large number of pixels, each pixel comprising a SPAD 4 and an isolation well 8 covered by an optical filter 12.

Figure 4:
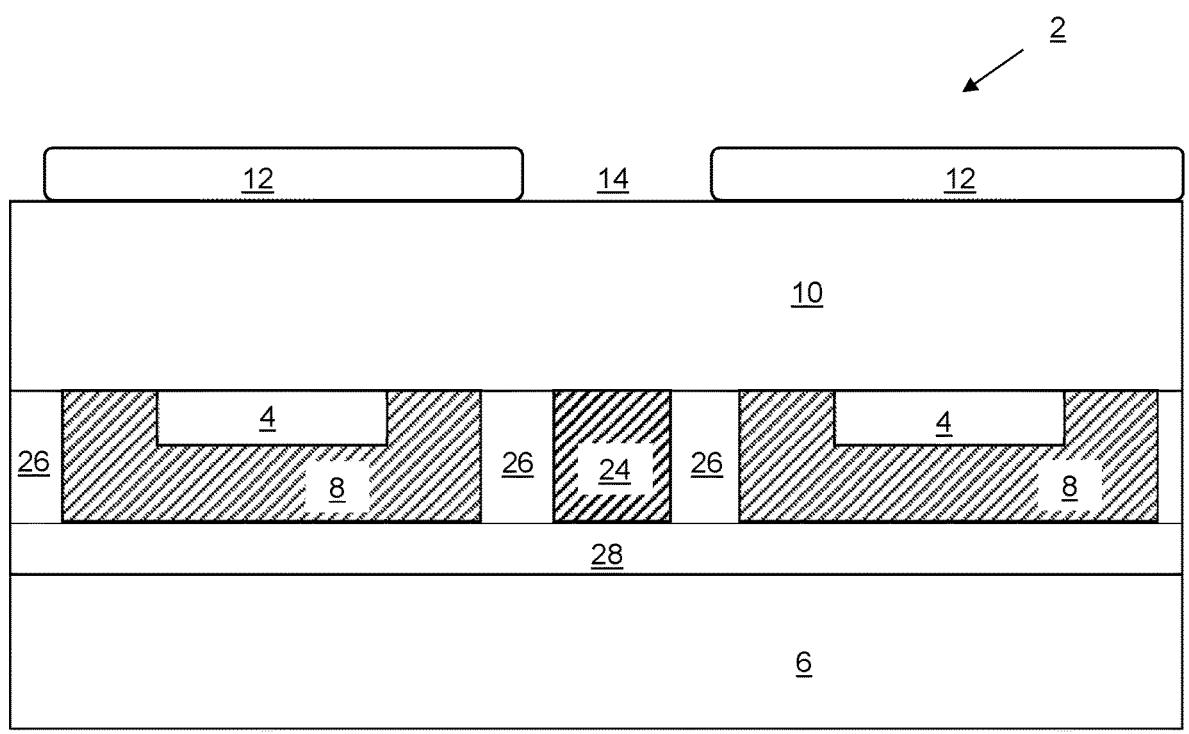
FIG. 4 shows a schematic cross section of a part of another embodiment of a semiconductor imaging apparatus comprising deep trench isolation.

FIG. 4 shows an embodiment of a semiconductor imaging apparatus 2 having a dielectric isolated SPAD 4. Similar to the embodiments illustrated in FIGS. 2 and 3, the light detector 2 comprises a silicon substrate 6, SPADs 4, isolation wells 8 around the SPADs 4, a backend stack 10, and an optical filter 12 covering the SPADs while leaving a gap 14 between neighboring SPADs 4. The light detector also comprises a photodiode 24 between the isolation wells 8 and separated from the isolation wells 8 by deep trench isolation (DTI). The photodiode 24 is arranged to detect light incident on the gap 14 in the optical filter 12. In this embodiment (and in the embodiment of FIG. 5, described below) the isolation wells 8 are not required to act as photodiodes, as they are not required to detect charge carriers.

Figure 5:
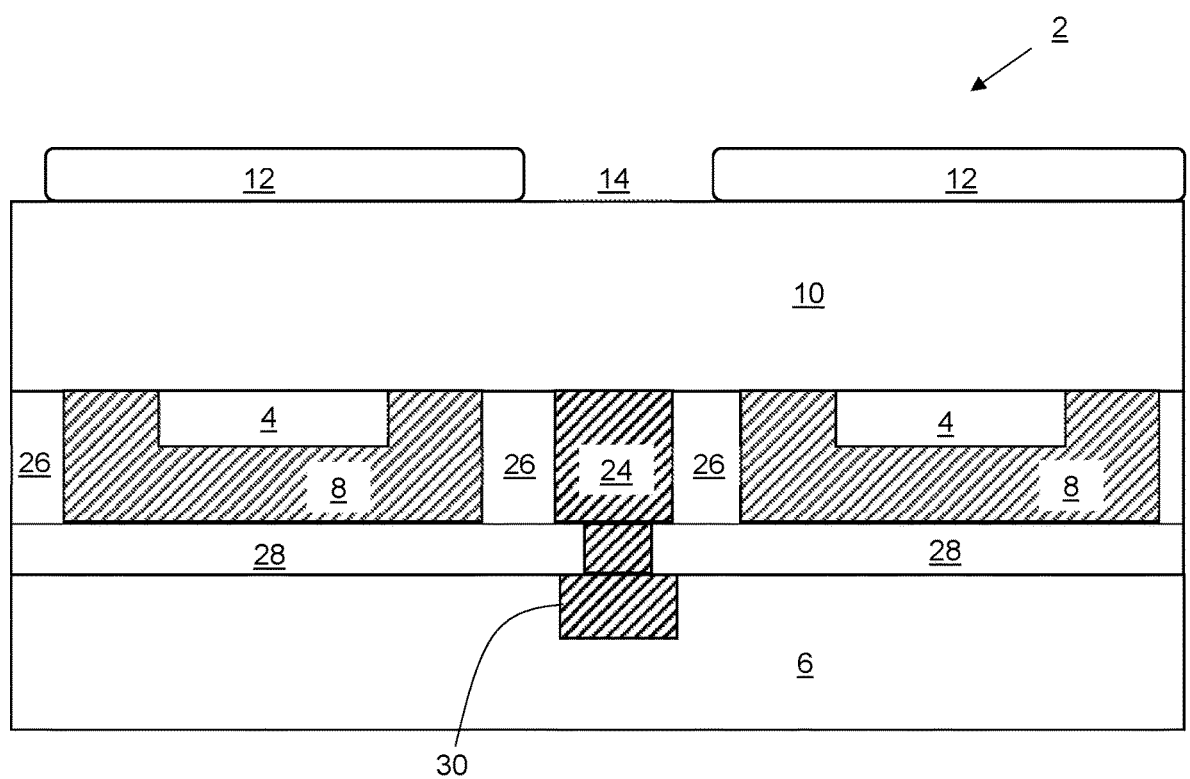
FIG. 5 shows a schematic cross section of a part of a further embodiment of a semiconductor imaging apparatus having a buried layer.

FIG. 5 shows another embodiment of the imaging apparatus, wherein the photodiode 24 is connected to a buried layer 30 in the substrate 6 below a buried oxide 28. This allows the photodiode to detect charge carriers generated in the substrate 6 below the buried oxide. The charge carriers generated in the substrate 6 cannot travel through the buried oxide 28, and must instead travel through the buried layer 30 to reach the photodiode 24. In addition to the photodiode 24 detecting light directly, this allows the photodiode 24 to detect longer wavelengths that penetrate deeper into the silicon substrate 6.

In general, embodiments of the semiconductor imaging apparatus comprise a light detection device (typically a SPAD, but optionally a PD or APD) in a silicon substrate, an optical filter (typically an IR filter) arranged to filter light incident on the light detection device and comprising a gap for allowing unfiltered light to reach the silicon substrate. The imaging apparatus further comprises an isolation structure (e.g. an isolation well and/or buried oxide and DTI) for stopping light generated charge carriers in the silicon substrate from reaching the light detection device, and a photodiode for detecting the charge carriers.

The isolation structure may comprise an isolation well that surrounds the light detection device, and the isolation well may be the photodiode. That is the isolation well is arranged as a photodiode in the imaging apparatus while also isolating the light detection device. The optical filter in one case covers both the light detection device and the isolation well, to prevent the light detection device from being triggered by unfiltered light. The gap in the optical filter is typically arranged to allow unfiltered light to reach the silicon substrate adjacent to the isolation well (between the isolation wells of neighboring pixels/devices).

Alternatively or in addition, the isolation structure may comprise a buried oxide layer and deep trench isolation (DTI), wherein the DTI separates the light detection device from a further photodiode. In this case, the further photodiode is generally located between two neighboring light detection devices (i.e. typically between neighboring SPADs). The photodiode can be connected to a buried layer in the silicon substrate below the buried oxide layer, so that the further photodiode can detect charge carriers generated in the silicon substrate below the buried oxide layer. This can allow the further photodiode to detect longer wavelengths that penetrate deeper into the silicon substrate.

The apparatus typically comprises a backend stack (e.g. a CMOS backend stack), which comprises a plurality of metal layers located between the silicon substrate and the optical filter. The metal layers provide electrical connections for input and output to the light detection devices and photodiodes of the imaging apparatus. The light detection device and the photodiode may be connected to the same or different metal layers.

Typically, the imaging apparatus is arranged to perform time of flight, TOF, measurements based on output from the light detection device, and to perform visible, VIS, light imaging based on output from the photodiode (i.e. classical imaging). The apparatus typically comprises a processing circuit for processing the output from the light detection device in order to determine the time of arrival of detected photons, and from the time of arrival determine a distance. The imaging apparatus may also comprise the emitter (e.g. pulsed IR light source) used to illuminate the object to be imaged. The processing circuit or another controller may trigger the emitter, which sets the start time for the TOF measurement.

Embodiments also comprise an imaging method for a semiconductor imaging apparatus as described above. The method comprises performing time-of-flight measurements, TOF, with the light detection device and, simultaneously with the TOF measurements, performing VIS photodiode sensing with the photodiode.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

What is claimed is:

1. A semiconductor imaging apparatus comprising:
   a plurality of light detection devices in a silicon substrate;
   an optical filter arranged to filter light incident on said light detection devices and comprising gaps for allowing unfiltered light to reach said silicon substrate between neighbouring light detection devices;
   an isolation structure for stopping light generated charge carriers in said silicon substrate from reaching said light detection devices; and
   a plurality of photodiodes for detecting said charge carriers in said silicon substrate, wherein said isolation structure comprises a buried oxide layer and deep trench isolation, DTI, wherein said DTI separates said light detection devices from said photodiodes, and wherein said photodiodes are connected to a buried layer in said silicon substrate below said buried oxide layer, so that said photodiodes can detect charge carriers generated in said silicon substrate below said buried oxide layer.

2. A semiconductor imaging apparatus according to claim 1, wherein said isolation structure comprises a plurality of isolation wells surrounding respective light detection devices of said plurality of light detection devices.

3. A semiconductor imaging apparatus according to claim 2, wherein said optical filter covers said light detection devices and said isolation wells.

4. A semiconductor imaging apparatus according to claim 2, wherein said gaps in said optical filter are arranged to allow unfiltered light to reach said silicon substrate adjacent to said isolation wells.

5. A semiconductor imaging apparatus according to claim 1, wherein each light detection device is a single photon avalanche diode, SPAD.

6. A semiconductor imaging apparatus according to claim 1, wherein each light detection device is another photodiode, or an avalanche photodiode, APD.

7. A semiconductor imaging apparatus according to claim 1, further comprising a backend stack comprising a plurality of metal layers located between said silicon substrate and said optical filter.

8. A semiconductor imaging apparatus according to claim 7, wherein said light detection devices are electrically connected to a first metal layer of said plurality of metal layers.

9. A semiconductor imaging apparatus according to claim 8, wherein said photodiodes are electrically connected to said first metal layer.

10. A semiconductor imaging apparatus according to claim 1, wherein said optical filter is an infrared, IR, filter.

11. A semiconductor imaging apparatus according to claim 1, wherein said optical filter is a bandpass filter having a central wavelength in the range of 850 nm to 940 nm.

12. A semiconductor imaging apparatus according to claim 1, further comprising an emitter for illuminating an object to be imaged by the imaging apparatus.

13. An imaging method for a semiconductor imaging apparatus according to claim 1, said method comprising:
    performing time-of-flight measurements, TOF, with said light detection devices; and
    simultaneously with said TOF measurements, performing visible light photodiode sensing with said photodiodes.

14. A semiconductor imaging apparatus comprising:
    a plurality of light detection devices in a silicon substrate;
    an optical filter arranged to filter light incident on said light detection devices and comprising gaps for allowing unfiltered light to reach said silicon substrate between neighbouring light detection devices; and
    an isolation structure for stopping light generated charge carriers in said silicon substrate from reaching said light detection devices, wherein said isolation structure comprises a plurality of isolation wells surrounding respective light detection devices of said plurality of light detection devices and wherein each isolation well is a photodiode for detecting said charge carriers in said silicon substrate,
    wherein said semiconductor imaging apparatus is arranged to perform time of flight, TOF, measurements based on output from said light detection devices, and wherein said semiconductor imaging apparatus is arranged to perform visible, VIS, light imaging based on output from said photodiodes.

* * * * *